United States Patent
Arai

(10) Patent No.: US 7,259,951 B2
(45) Date of Patent: Aug. 21, 2007

(54) SEMICONDUCTOR DEVICE

(75) Inventor: Takao Arai, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 342 days.

(21) Appl. No.: 11/075,861

(22) Filed: Mar. 10, 2005

(65) Prior Publication Data
US 2005/0200398 A1 Sep. 15, 2005

(30) Foreign Application Priority Data
Mar. 12, 2004 (JP) ............... 2004-070536

(51) Int. Cl.
H02H 3/08 (2006.01)
(52) U.S. Cl. .............. 361/93.7; 361/58; 361/101
(58) Field of Classification Search ............ 361/93.1, 361/93.7, 100, 101, 58
See application file for complete search history.

(56) References Cited

U.S. PATENT DOCUMENTS

| | | | | |
|---|---|---|---|---|
| 4,553,084 A | | 11/1985 | Wrathall | |
| 4,893,158 A | * | 1/1990 | Mihara et al. | 257/341 |
| 5,008,586 A | * | 4/1991 | Miyazaki et al. | 323/315 |
| 5,369,308 A | * | 11/1994 | Schoofs et al. | 327/427 |
| 5,621,601 A | * | 4/1997 | Fujihira et al. | 361/93.9 |
| 2005/0083027 A1 | * | 4/2005 | Kikuchi | 323/287 |

* cited by examiner

Primary Examiner—Stephen W. Jackson
Assistant Examiner—Terrence Willoughby
(74) Attorney, Agent, or Firm—McGinn IP Law Group, PLLC

(57) ABSTRACT

A semiconductor device comprises an output transistor for controlling current that flows between a first terminal and a second terminal, a detection transistor connected in parallel with the output transistor, a detection resistor connected in series with the detection transistor, for detecting current that flows through the detection transistor as detection voltage and of which the resistance value is set in proportion to the potential difference between the first terminal and the second terminal and an over-current protection transistor for decreasing the ON current of the output transistor and the detection transistor according to the increase of the detection voltage.

17 Claims, 11 Drawing Sheets

RELATED ART

SEMICONDUCTOR DEVICE

BACKGROUND OF THE INVENTION

1. Field of the Invention

The present invention relates to a semiconductor device, and more particularly to a semiconductor device having a load short circuit protection function.

2. Description of the Related Art

With the current advances in technology, a semiconductor device having an over-current protection function for protecting a semiconductor device from over-current that flows when load is shorted is in practical use. This over-current protection function is for suppressing the power consumption of the semiconductor device and protecting the semiconductor device from breakdown by controlling the current that flows through the semiconductor device when such an abnormality as a load short circuit occurs. FIG. 10 shows a circuit configuration of a conventional semiconductor device disclosed in U.S. Patent Gazette No. 4553084. When the gate voltage for driving the output MOSFET 101 is applied to the control terminal 102, this gate voltage is applied to the gates of the output MOSFET 101 and detection MOSFET 104 for monitoring the output current via the gate register 103, main current flows through the output MOSFET 101, and detection current flows through the detection MOSFET 104. This detection current is set to a value that is about 1/1000-1/10000 of the main current. If the circuits connected to the output MOSFET 101 are in normal status, the detection voltage based on the detection of the detection resistor 105 is kept smaller than the threshold voltage of the over-current protection MOSFET 106, and MOSFET 106 is kept in OFF status. FIG. 11 shows the drain current ID, which is a main current with respect to the voltage VDS between the source and drain of the output MOSFET 101 in this status.

If such an accident as a load short circuit occurs to a load or to a load circuit 116 connected to the output MOSFET 101 and excessive main current flows into the output MOSFET 101, the detection current that flows through the detection MOSFET 104 increases, and detection voltage, based on the drop in voltage of the detection resistor 105, also increases. And if the detection voltage exceeds the threshold voltage of the over-current protection MOSFET 106, the MOSFET 106 turns ON and the input to the output MOSFET 101 is divided by the gate resistor 103 and the over-current protection MOSFET 106, so the potential at the potential point A dramatically drops. If the potential at the potential point A drops, the main current of the output MOSFET 101 and the detection current of the detection MOSFET 104 also decrease as the gate voltage drops, and a breakdown of the output MOSFET 101 by the over-current is prevented. In this case, the potential of the potential point A drops according to the magnitude of the detection voltage to be applied to the gate of the over-current protection MOSFET 106.

Also recently a circuit for detecting the voltage between the source and drain of the output MOSFET and a circuit for adjusting the voltage between the gate and source of the output MOSFET and changing to a desired current limit value are proposed. FIG. 12 shows the current limiting characteristics of a conventional semiconductor device stated in "Smart Highside Power Switch", Data sheet BTS 6143D, p. 13, FIG. 3a, Infineon Technologies AG in Germany, Oct. 1, 2003, which is disclosed on internet and found by searching on Feb. 17, 2004 at URL: http://www.infineon.com/cmc_upload/documents/014/444/BTS6143D_20030925.pdf. In the case of the technique disclosed in "Smart Highside Power Switch", five sets of over-current detection circuits are connected in parallel so as to implement five stages of current limiting, as shown in FIG. 12. By this, power consumption can be suppressed more closely by changing the current limit value for each voltage of the voltages between the drain and source of the output MOSFET.

In this case, a double diffusion type field effect transistor composed of cells, shown in FIG. 13 and FIG. 14, is normally used for the output MOSFET 101 and the detection MOSFET 104 shown in FIG. 10. A MOSFET where channels are formed in the vertical direction with respect to the semiconductor substrate face, such as the case of the double diffusion type field effect transistor, is called a "vertical MOSFET". FIG. 13 is a plain view of a vertical MOSFET and FIG. 14 is a cross-sectional view along the XIV-XIV line in FIG. 13. This vertical MOSFET has a structure where a plurality of unit cells, in which one source electrode 107 is surrounded by the gate electrode 108, and an epitaxial layer 110 having low density n-type impurities (n−) is formed on a semiconductor substrate 109 having high density n-type impurities (n+), and using these as a drain area, a double diffusion area which is composed of a base area 111 having p-type impurities and a source area 112 having high density n-type impurities is formed in the epitaxial layer 110, and the gate electrode 108, source electrode 107 and drain electrode 113 are formed respectively, as shown in FIG. 14.

This double diffusion type field effect transistor becomes more and more miniaturized every year so as to decrease the ON resistance per unit area. For example, the conventional semiconductor device shown in FIG. 15 and FIG. 16 is known as a structure with less ON resistance. FIG. 15 is a plain view of a conventional semiconductor device, and FIG. 16 is a cross-sectional view along the XVI-XVI line in FIG. 15. This conventional semiconductor device is a semiconductor device with a trench structure where the gate electrode 108 is buried in the base area 111 and epitaxial layer 110.

A merit of using a double diffusion type field effect transistor of which the ON resistance per unit area is low is that the size of the output MOSFET can be decreased. However if a double diffusion type field effect transistor of which the ON resistance per unit area is low is used, the conventional semiconductor device shown in FIG. 10 has the following problem. That is, unless the current limit value is decreased for the amount of the decreased size of the output MOSFET, the heating value when such an abnormality as a load short circuit occurs increases, which makes it easier for the semiconductor device to breakdown, and if the current limit value is decreased, the semiconductor device cannot be used for high output applications where large current flows.

In the case of the technique disclosed in "Smart Highside Power Switch", the current limit value is increased in an area where voltage is low, that is a safe operation area, and the current limit value is decreased in an area where voltage is high, that is outside the safe operation area. The structure of the technique disclosed in "Smart Highside Power Switch" requires a voltage detection circuit and a circuit to change the current limit value for each stage, so the circuit scale is about five times larger than the semiconductor device in FIG. 10, which is the downside of this approach.

SUMMARY OF THE INVENTION

According to one aspect of the present invention, there is provided a semiconductor device comprising an output transistor for controlling current that flows between a first terminal and a second terminal, a detection transistor connected in parallel with the output transistor, a detection resistor connected in series with the detection transistor, for detecting current that flows through the detection transistor as detection voltage and of which the resistance value is set in proportion to the potential difference between the first terminal and the second terminal and an over-current protection transistor for decreasing the ON current of the output transistor and the detection transistor according to the increase of the detection voltage.

According to another aspect of the present invention, there is provided a semiconductor device comprising a drive circuit for controlling drive current that flows through a load, a detection resistor to which detection current for detecting the drive current is supplied and of which the resistance value changes based on a predetermined potential of the drive circuit on a route where the drive current flows and a control circuit for controlling the drive status of the drive circuit based on the voltage of the detection resistor.

According to yet another aspect of the present invention, there is provided a semiconductor device comprising an output transistor of which drain is connected to a first power supply via a load and source is connected to a second power supply, a detection transistor of which drain is connected to the drain of said output transistor and gate is connected to the gate of the output transistor, a detection resistor of which one end is connected to the source of the detection transistor and the other end is connected to the source of the output transistor, and of which resistance value changes based on the drain voltage of the output transistor and an over-current protection transistor of which drain is connected to the gate of the output transistor, source is connected to the source of the output transistor, and gate is connected to the source of the detection transistor.

By this invention, the resistance value of the detection resistor increases and the current of the output transistor (drain current) decreases as the voltage of the output transistor (drain voltage) increases. Therefore the flow of over-current is limited and power consumption can be deceased when load is abnormal, and the semiconductor device can be protected from breakdown. Also it is not necessary to dispose a plurality of over-current detection circuits and current control circuits, therefore the circuit scale and the area of the semiconductor chip can be decreased.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
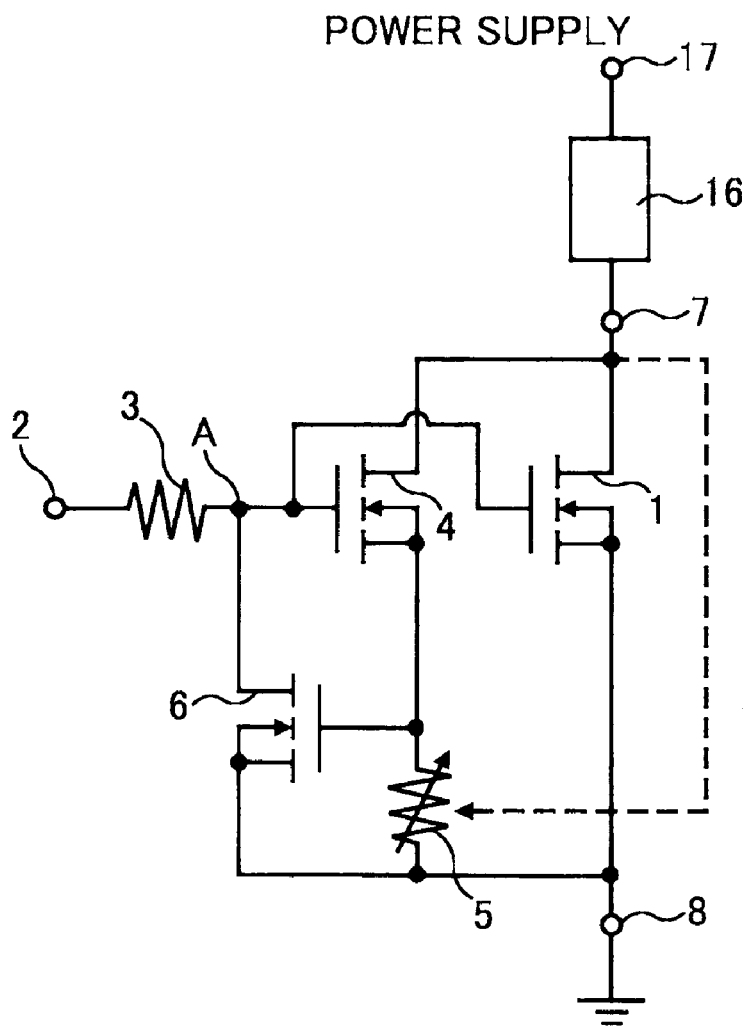
FIG. 1 is a diagram showing a circuit configuration of a semiconductor device having a load short circuit protection function according to the first embodiment of the present invention.
Figure 10:
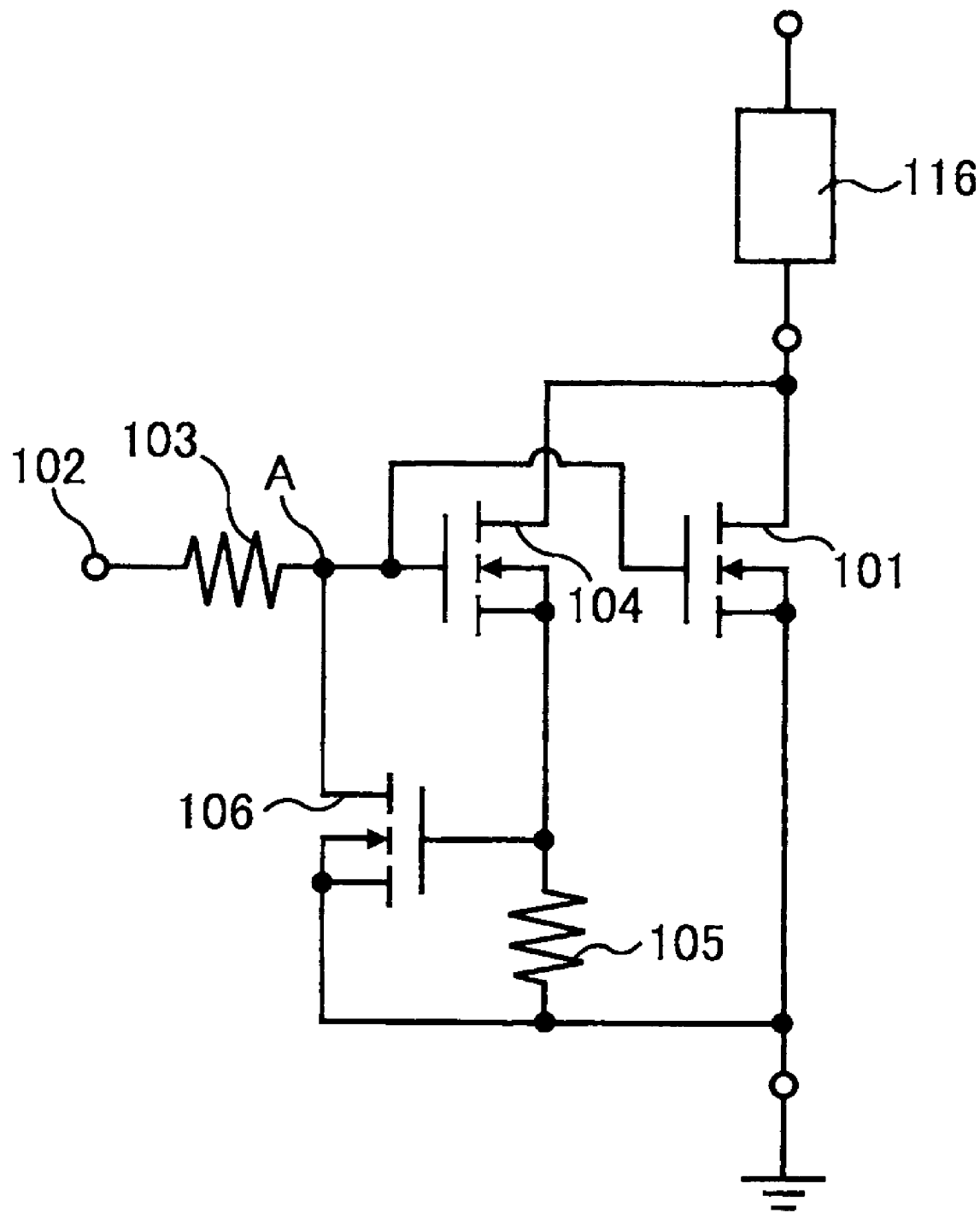
FIG. 10 is a diagram showing a circuit configuration example of a conventional semiconductor device having a load short circuit protection function.
Figure 11:
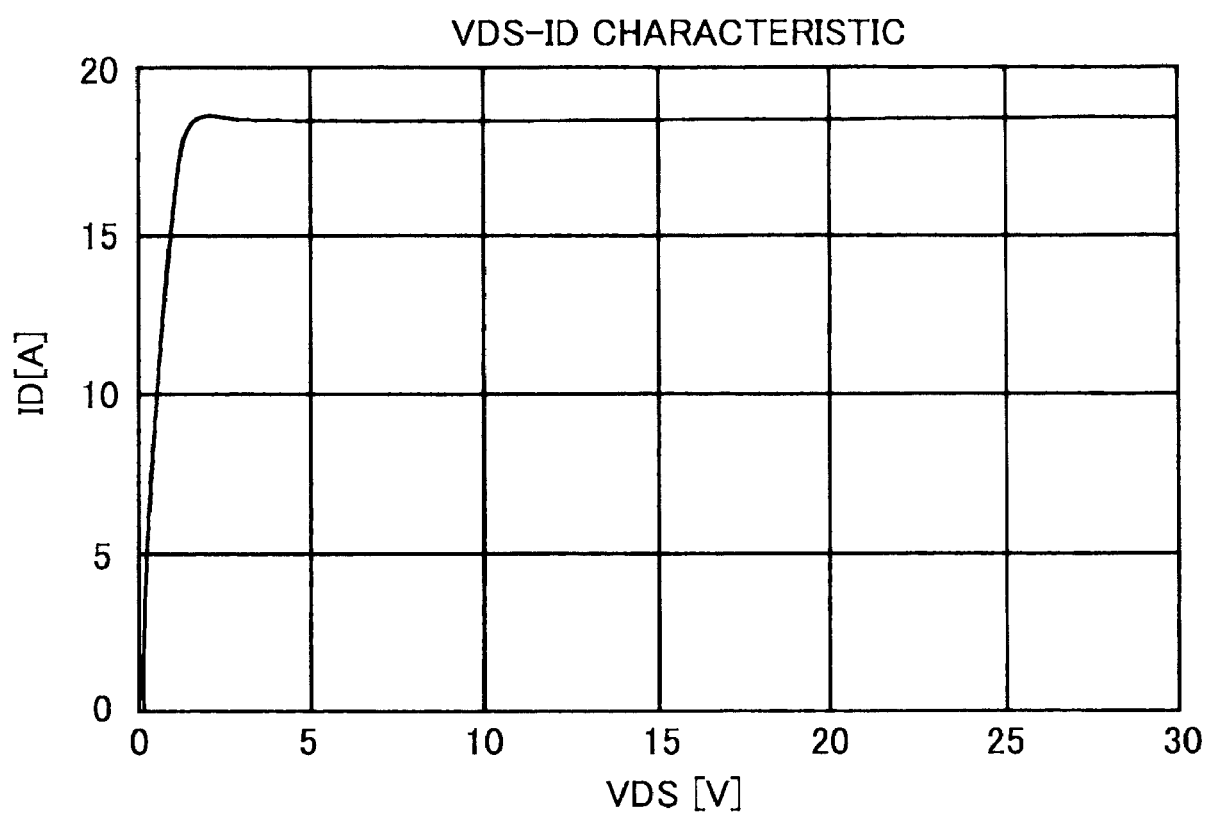
FIG. 11 is a graph showing the main current characteristics with respect to the drain-source voltage of a conventional semiconductor device having a load short circuit protection function.
Figure 12:
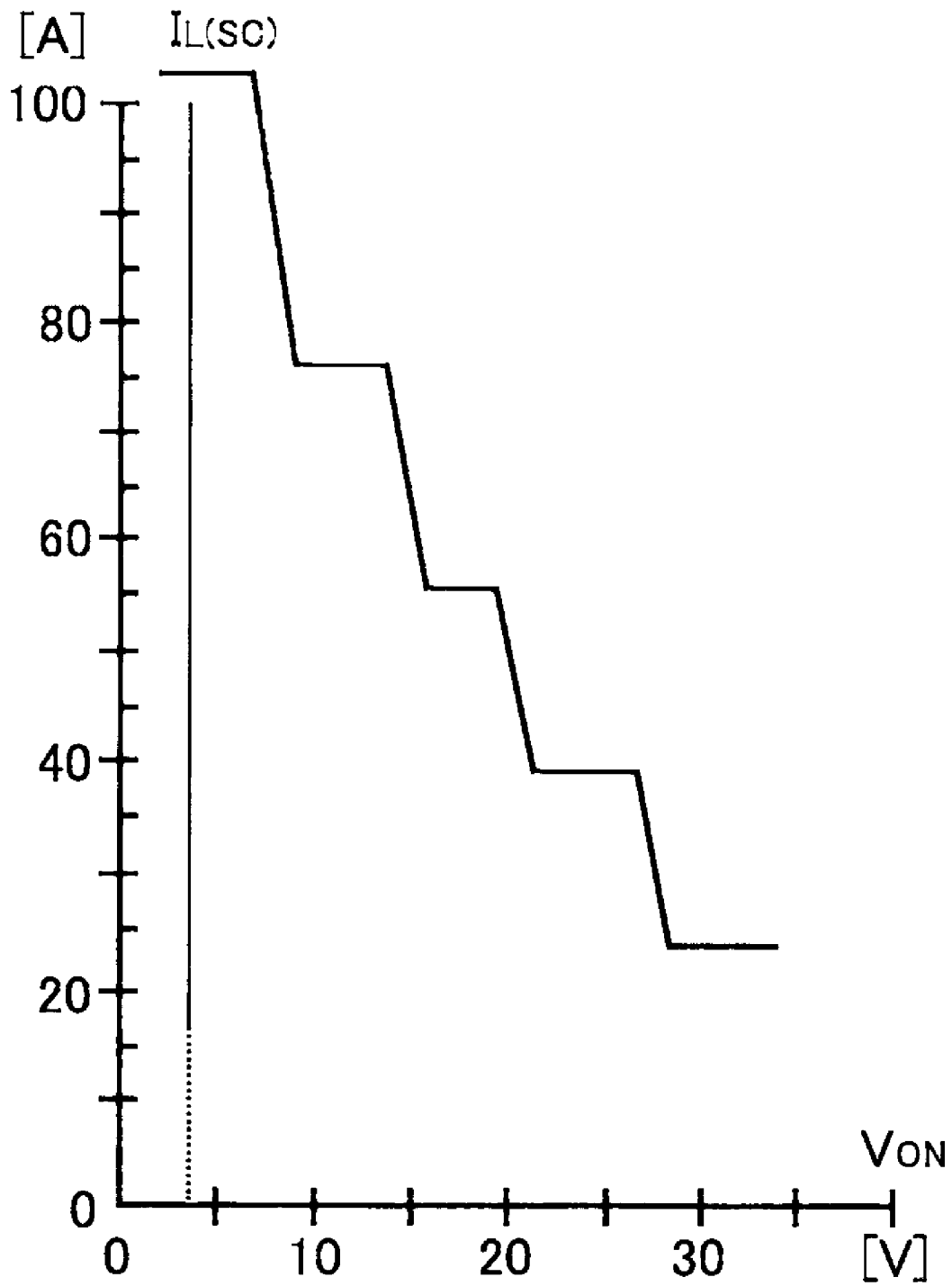
FIG. 12 is a graph showing the main current characteristics with respect to the drain-source voltage of another conventional semiconductor device having a load short circuit protection function.
Figure 13:
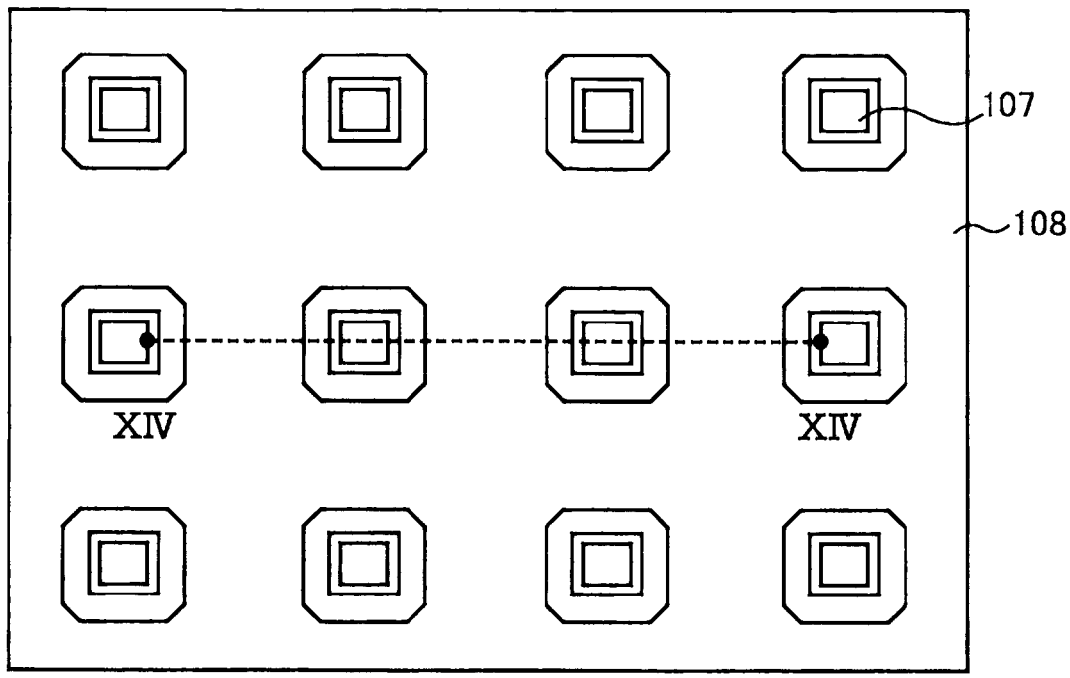
FIG. 13 is a plain view showing a double diffusion type field effect transistor.
Figure 14:
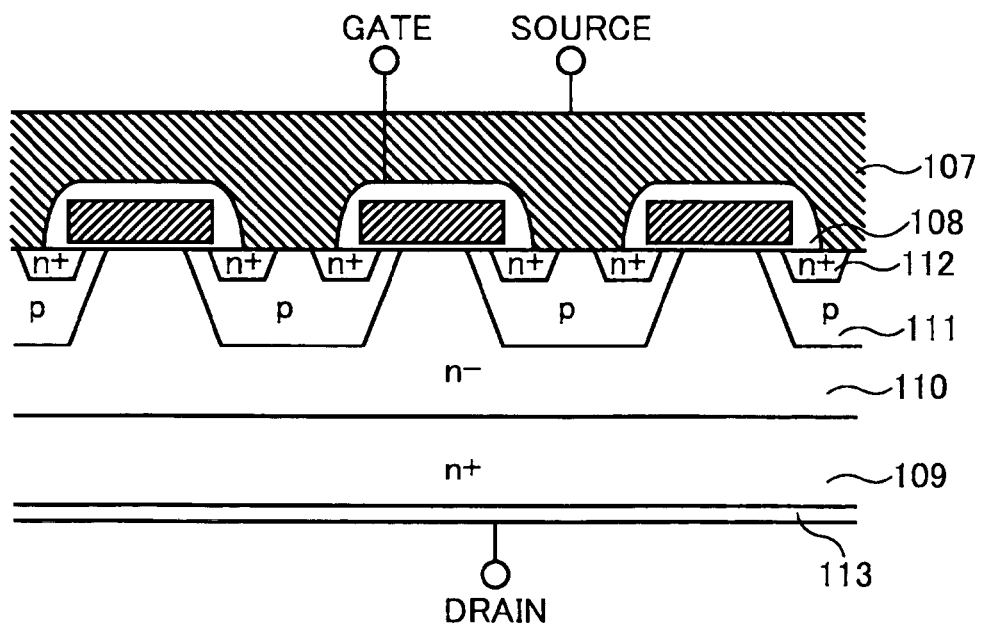
FIG. 14 is a cross-sectional view along the XIV-XIV line of the double diffusion type field effect transistor.
Figure 15:
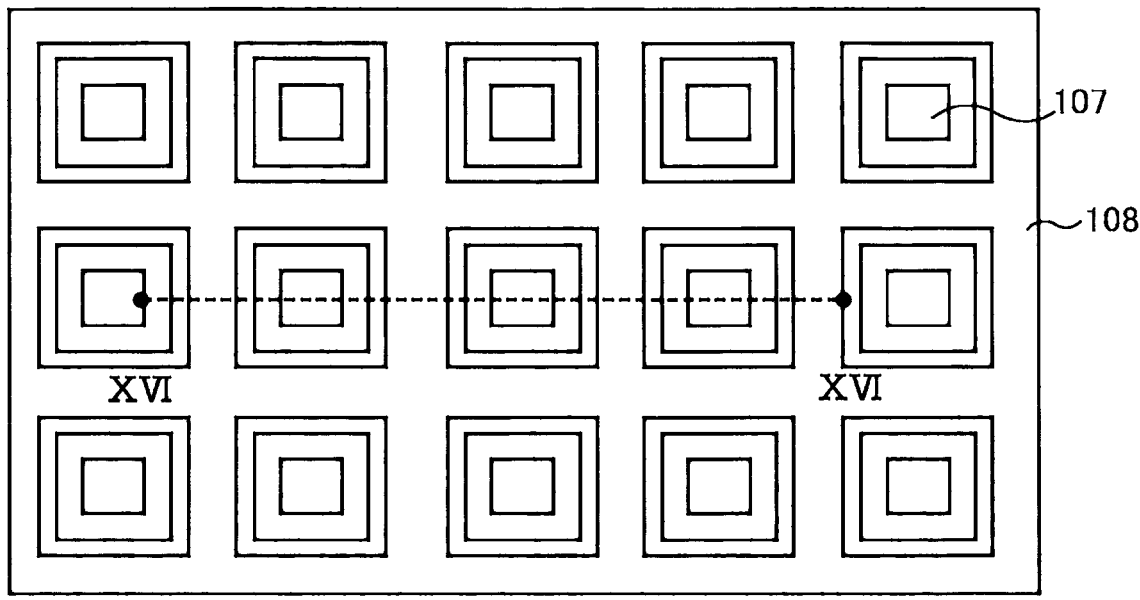
FIG. 15 is a plain view showing a gate electrode buried double diffusion type field effect transistor.
Figure 16:
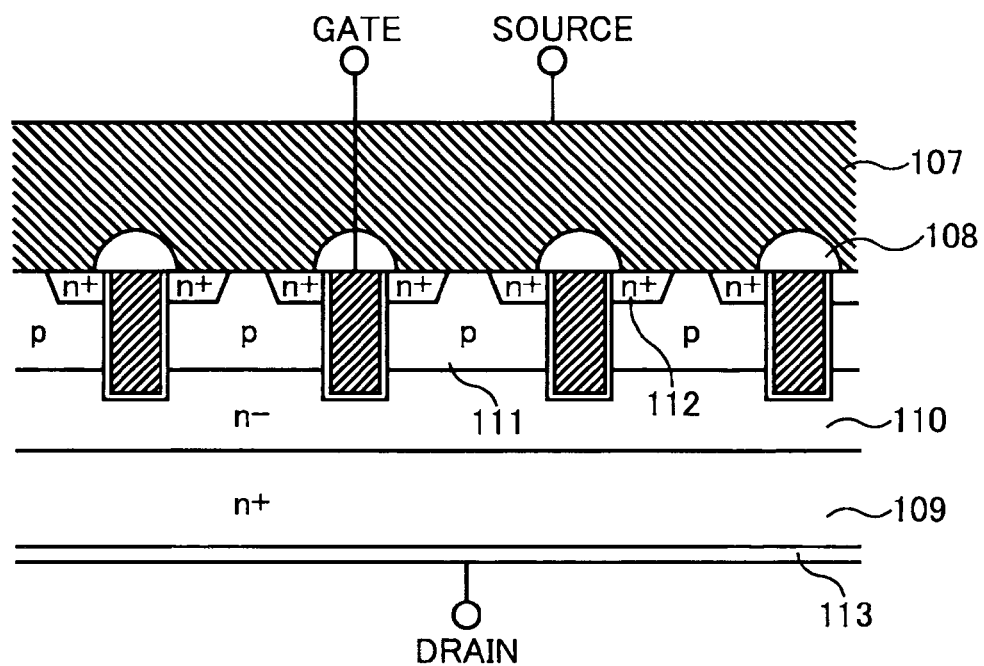
FIG. 16 is a cross-sectional view along the XVI-XVI line showing the gate electrode buried double diffusion type field effect transistor.

The first embodiment of the present invention will now be described with reference to the drawings. FIG. 1 is a circuit diagram showing the configuration of the semiconductor device according to the first embodiment of the present invention. This semiconductor device comprises a detection resistor 5 of which the resistance value changes depending on the drain voltage, instead of the detection resistor 105, which has a fixed resistance value, of the conventional art in FIG. 10. The output MOSFET 1, detection MOSFET 4 and detection resistor 5 in FIG. 1 are formed on a same semiconductor substrate, and the output MOSFET 1 and detection MOSFET 4 have a vertical double diffusion type field effect transistor structure composed of the cell configuration in FIG. 13 and FIG. 14, or a structure burying the gate electrode 107 in FIG. 15 and FIG. 16 as a structure where the ON resistance is smaller. Components other than the detection resistor 5 are formed in a conventional structure by a conventional manufacturing method.

As shown in FIG. 1, the semiconductor device has the output MOSFET 1 constituting the main current switch. The drain of the output MOSFET 1 is connected to the first terminal 7 and the source is connected to the second terminal 8. The semiconductor device also has a current limiting circuit comprising the detection MOSFET 4, detection resistor 5 and over-current protection MOSFET 6. The detection MOSFET 4 is connected with the output MOSFET 1 in parallel, the drain is connected to the first terminal 7, the gate is connected with the gate of the output MOSFET 1 at the potential point A and is connected to the control terminal 2 via the gate resistor 3, and the source is connected to one terminal of the detection resistor 5 and the gate of the over-current protection MOSFET 6. In the over-current protection MOSFET 6, the drain is connected to the gate of the detection MOSFET 4 and the source is connected to the second terminal 8. The other terminal of the detection resistor 5 is also connected to the second terminal 8. The output MOSFET 1 is a drive circuit for controlling drive current that flows through the load circuit 16. The detection resistor 5 is a resistor to which detection current for detecting the drive current is supplied and of which the resistance value changes based on a predetermined potential (the potential of the first terminal 7) of the output MOSFET 1 on a route where the drive current flows. The over-current protection MOSFET 6 is a control circuit for controlling the drive status of the output MOSFET 1 based on the voltage of the detection resistor 5.

Figure 2:
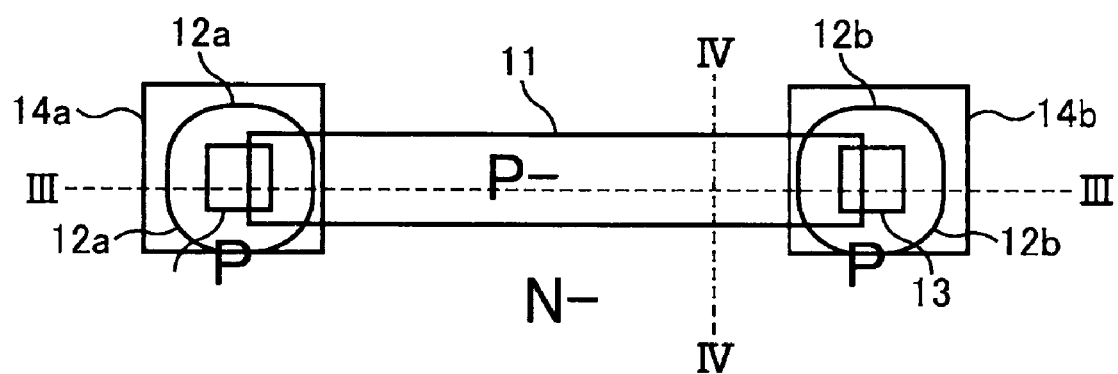
FIG. 2 is a plain view showing the detection resistor of the semiconductor device having a load short circuit protection function according to the first embodiment of the present invention.
Figure 3:
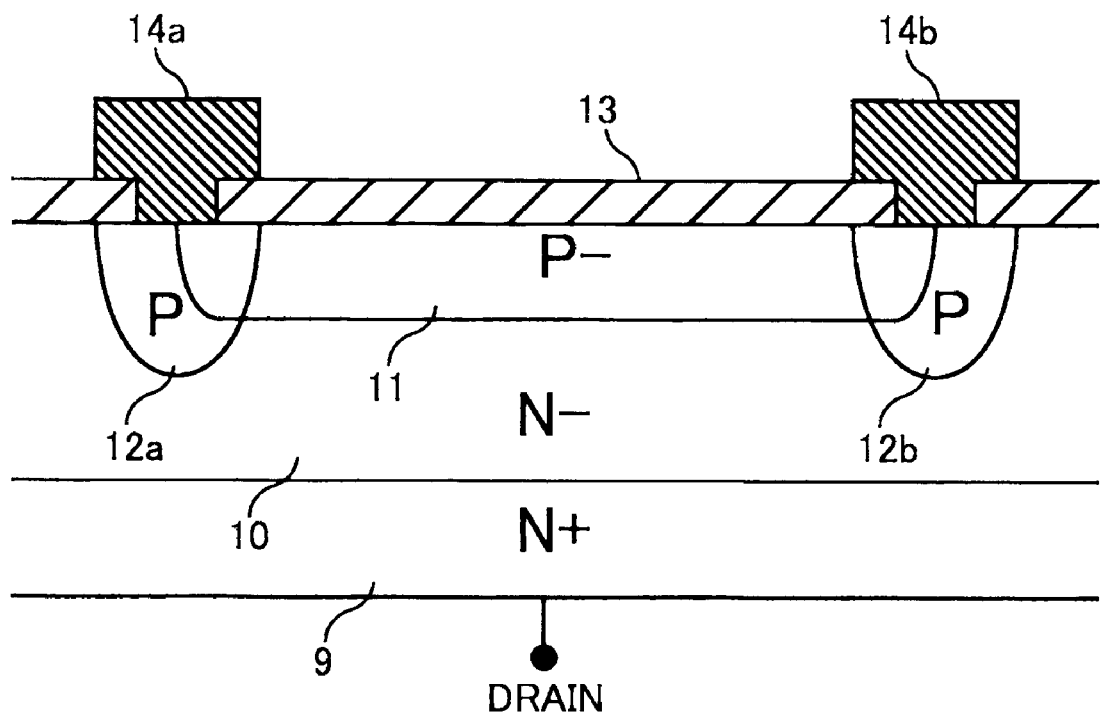
FIG. 3 is a cross-sectional view along the III-III line showing the detection resistor of the semiconductor device having a load short circuit protection function according to the first embodiment of the present invention.
Figure 4:
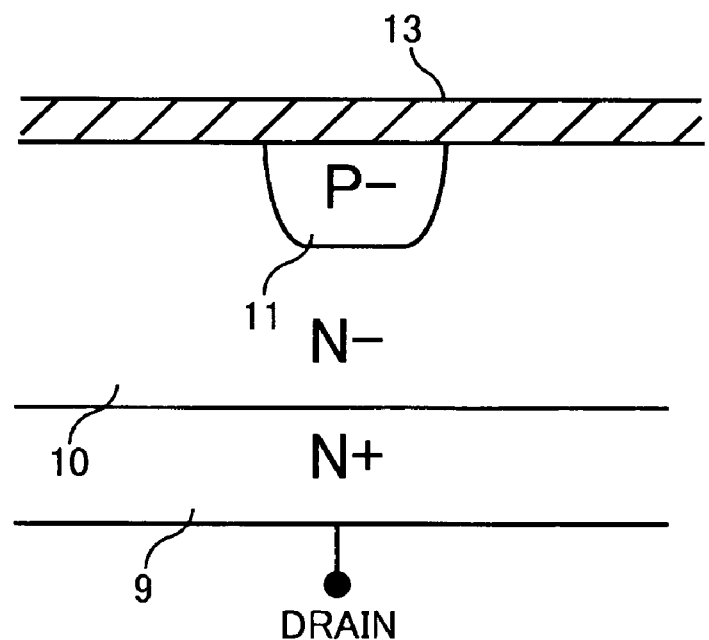
FIG. 4 is a cross-sectional view along the IV-IV line showing the detection resistor of the semiconductor device having a load short circuit protection function according to the first embodiment of the present invention.

FIG. 2 is a plain view of the detection resistor 5 in FIG. 1, and FIG. 3 and FIG. 4 are cross-sectional views along the III-III line and the IV-IV line respectively in FIG. 2. In FIG. 3, the epitaxial layer 10 having low density n-type impurities is formed on the semiconductor substrate 9 having high density n-type impurities. The semiconductor substrate 9 and the epitaxial layer 10 become a part of the drain area of the output MOSFET 1. The semiconductor layer 11 having low density p-type impurities and the contact layers 12a and 12b having p-type impurities are formed in the epitaxial layer 10, and the insulation film 13 including an oxide film is formed on these layers and the epitaxial layer 10, and the electrodes 14a and 14b which are electrically connected with the contact layers 12a and 12b are formed on the contact layers 12a and 12b. The semiconductor layer 11 is a first semiconductor layer. A combination of the semiconductor substrate 9 and the epitaxial layer 10 is a second semiconductor layer. Although not illustrated, the electrodes 14a and 14b are connected to the source electrode of the output MOSFET 1 and source electrode of detection MOSFET 4 respectively. A drain voltage is applied from the bottom to the semiconductor substrate 9. By connecting the semiconductor layer 11 and epitaxial layer 10, the same voltage as the voltage VDS between the drain and source of the output MOSFET 1 is applied to the detection resistor 5. Therefore if the drain voltage is increased, the amount of electric charges to flow decreases since the depletion layer where many carriers do not exist, spread in the semiconductor layer 11, and the resistance value of the semiconductor layer 11 increases.

In FIG. 1, the first terminal 7 of the semiconductor device is connected to the power supply 17 via the load circuit 16, and the second terminal 8 is grounded. When the gate voltage for driving the output MOSFET 1 is applied to the control terminal 2, this gate voltage is applied to the gates of the output MOSFET 1 and the detection MOSFET 4 via the gate resistor 3, and main current flows through the first terminal 7 which is the drain of the output MOSFET 1 and the second terminal 7 which is the source thereof, and detection current flows through the detection MOSFET 4 at the same time. The detection current is set to a value about 1/1000-1/10000 of the main current. The detection current flows through the detection resistor 5 which is connected to the detection MOSFET 4 in series, and detection voltage is detected by the drop in voltage generated in the detection resistor 5. If the detection voltage exceeds the threshold voltage of the over-current protection MOSFET 6, the over-current protection MOSFET 6 turns ON and is shorted via the ON resistor of the over-current protection MOSFET 6, and gate voltage at the potential point A drops dramatically. This gate voltage drops according to the magnitude of the detection voltage to be applied to the gate of the over-current protection MOSFET 6. If the gate voltage at the potential point A drops, the main current of the output MOSFET 1 and the current of the detection MOSFET 4 also decrease according to the drop in the gate voltage.

Figure 5:
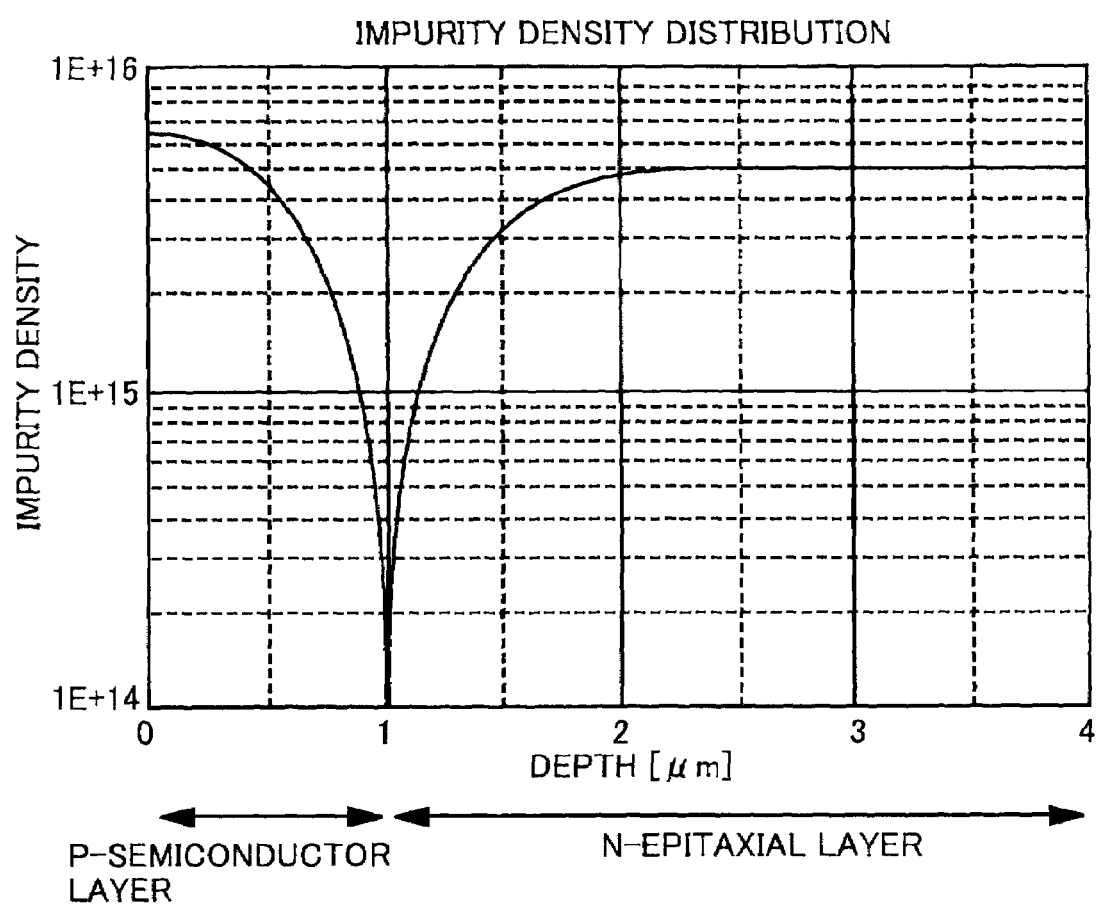
FIG. 5 is a graph showing the impurity density distribution set in a semiconductor layer of the detection resistor according to the first embodiment of the present invention.
Figure 6:
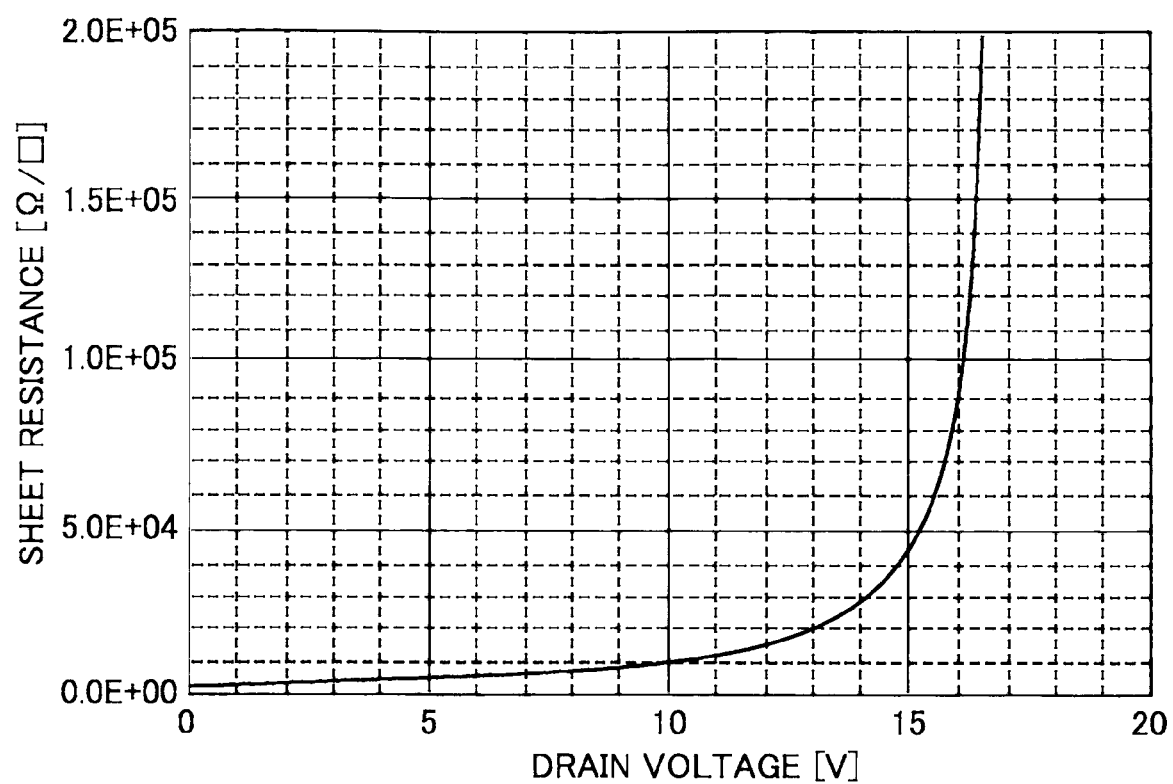
FIG. 6 is a graph showing the sheet resistance characteristics with respect to the drain voltage of the semiconductor layer of the detection resistor according to the first embodiment of the present invention.
Figure 7:
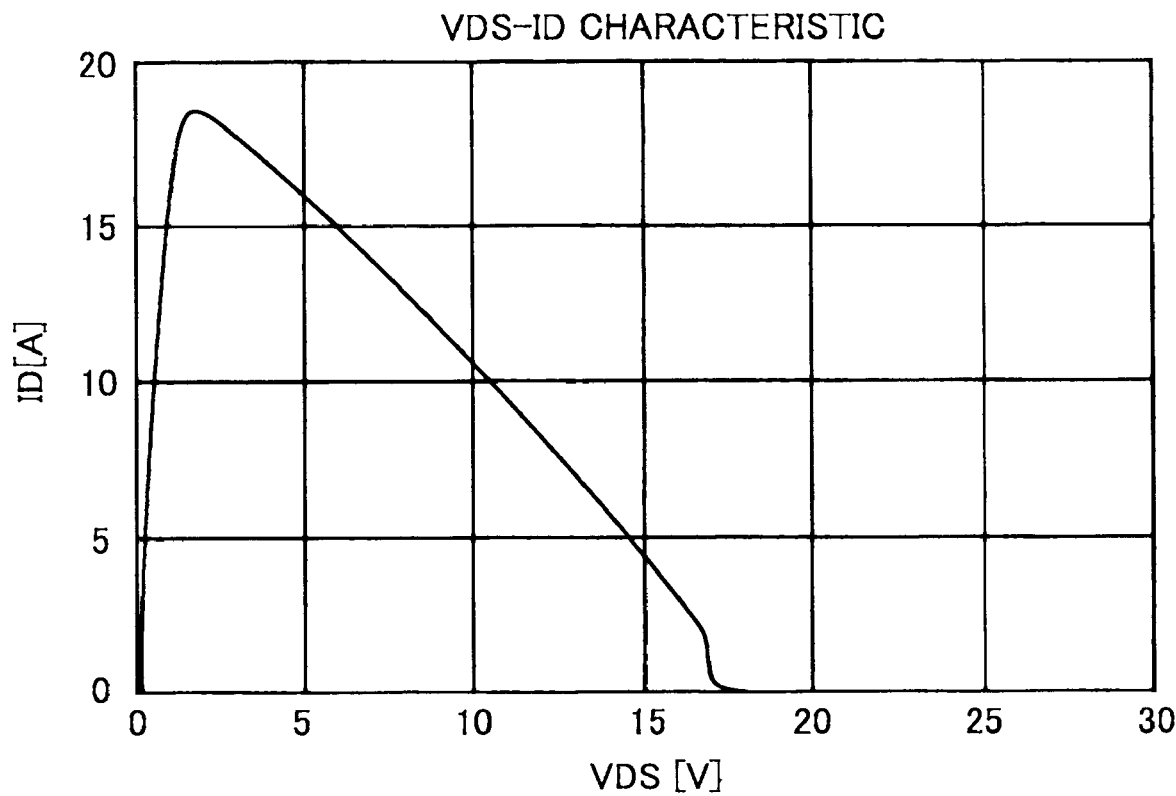
FIG. 7 is a graph showing the main current characteristics with respect to the drain-source voltage of the semiconductor device having a load short circuit protection function according to the first embodiment of the present invention.

For example, if the impurity density distribution of the semiconductor layer 11 of the detection resistor 5 is set as shown in FIG. 5, the drain voltage to be applied to the detection resistor 5 is 16.5V, the entire semiconductor layer 11 is depleted, and the resistance value of the detection resistor 5 becomes infinite. At this time, the sheet resistance of the semiconductor layer 11, with respect to the drain voltage, becomes the value shown in FIG. 6. In this case, the drain current characteristic, with respect to the drain-source voltage VDS of the output MOSFET 1, becomes as shown in FIG. 7, where as the drain-source voltage VDS of the output MOSFET 1 increases, the drain current ID decreases, and the drain current ID stops flowing at voltage 16.5V at which the entire semiconductor 11 is depleted. The voltage at which the drain current ID stops flowing can be changed by the impurity density and the depth of the junctions of the semiconductor layer 11, but must be set to a value that is higher than the load drive voltage.

The configuration of the present invention, with which the drain current ID that can flow is limited and decreased if the drain voltage rises, can decrease the power consumption when such an abnormality as a load short circuit occurs, and prevent the semiconductor device from breakdown, and also increase the current limit value in an area where voltage is low, which is a safe operation area, so a semiconductor device which can be used for high current can be implemented using a current limiting circuit with a small circuit scale.

Now the manufacturing method for the detection resistor portion of the semiconductor device according to the first embodiment will be described with reference to FIG. 3. First the epitaxial layer 10 having low density n-type impurities is formed by epitaxial growth as a drain area of the output MOSFET 1 on the semiconductor substrate 9 having high density n-type impurities. Then boron ions at a 12 to 13 power order per 1 cm$^2$ are implanted into a partial area of this epitaxial layer 10 by an ion implanter, then thermal processing is performed for several hours at a 1100-1200° C. temperature to form a semiconductor layer 11 having low density p-type impurities. By a similar method, contact layers 12a and 12b having p-type impurities are formed so as to be connected to opposite ends of the semiconductor layer 11 respectively.

Then an insulation film 13 including oxide film is formed on the surface. The insulation film at the center part of the contact layers 12a and 12b is removed, and the electrodes 14a and 14b made of aluminum are formed, and a semiconductor device having a detection resistor 5, of which the resistance value changes depending on the drain voltage of the output MOSFET 1, is created.

Second Embodiment

Figure 8:
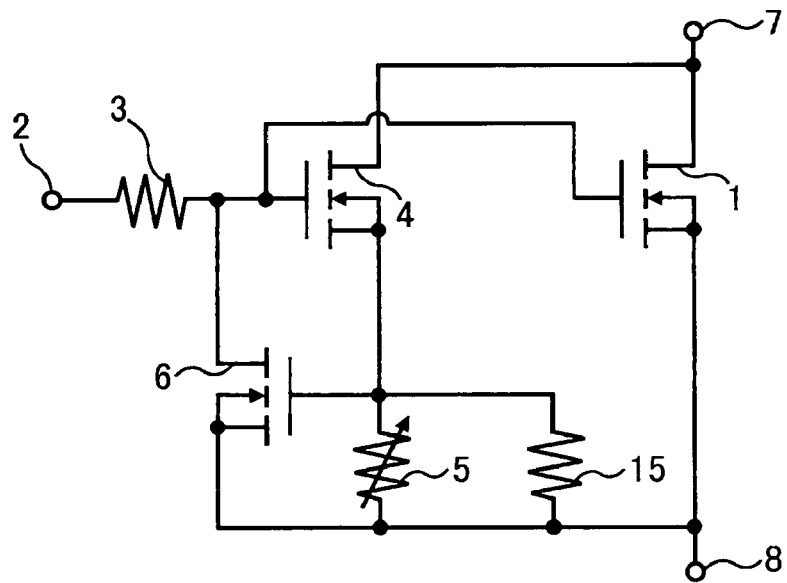
FIG. 8 is a diagram showing the circuit configuration of a semiconductor device having a load short circuit protection function according to the second embodiment of the present invention.
Figure 9:
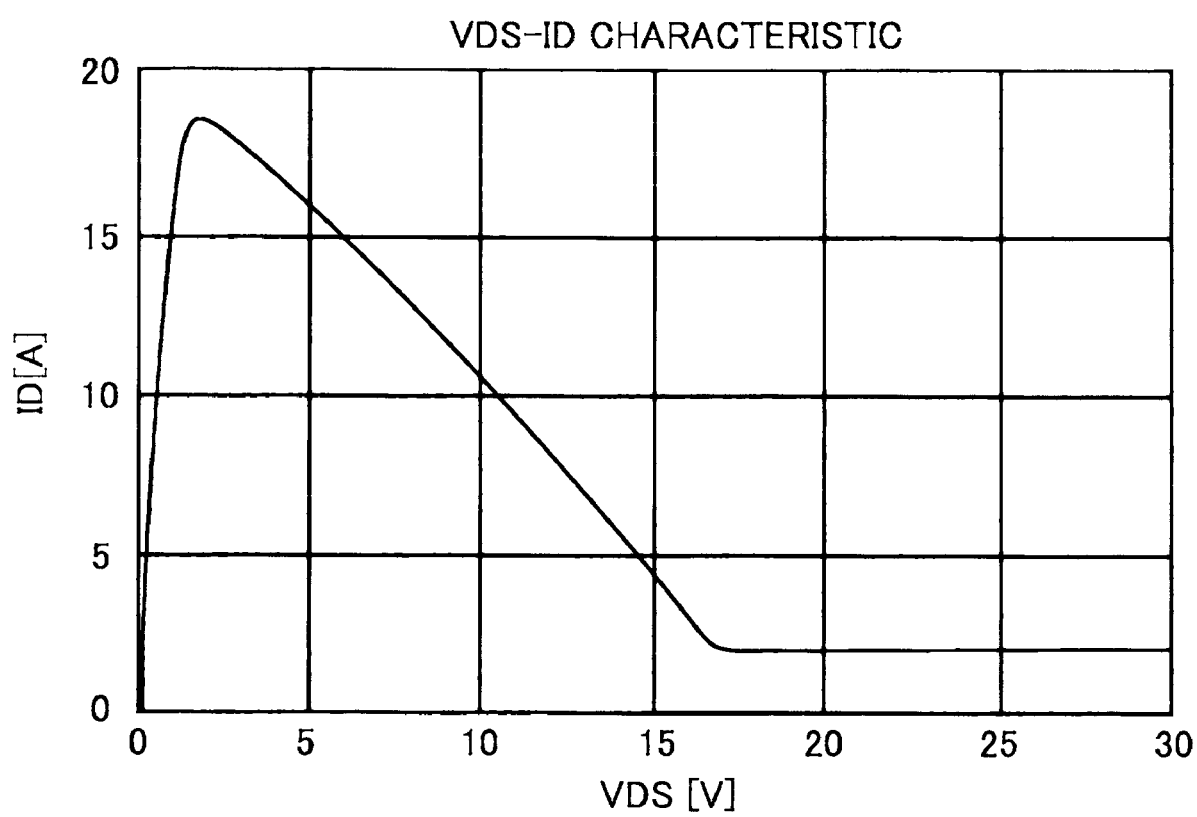
FIG. 9 is a graph showing the main current characteristics with respect to the drain-source voltage of a semiconductor device having a load short circuit protection function according to the second embodiment of the present invention.

Now the second embodiment of the present invention will be described in detail with reference to the drawings. FIG. 8 is a circuit diagram showing the configuration of the semiconductor device according to the second embodiment of the present invention, where composing elements the same as the first embodiment in FIG. 1 are denoted with the same reference symbols. The difference from the first embodiment is that a resistor 15 having a fixed resistance value is connected in parallel to the detection resistor 5. By this configuration, the resistance value between the source of the output MOSFET 1 and the source of the detection MOSFET 4 does not become infinite even if the drain current ID according to the fixed resistance value of the resistor 15 flows, and the drain voltage of the detection resistor 5 becomes a value with which the entire semiconductor layer 11 is depleted. FIG. 9 shows the drain current characteristic with respect to the drain-source voltage VDS of the output MOSFET 1, where as the drain-source voltage VDS of the output MOSFET 1 increases, the drain current ID decreases, and even at voltage 16.5V or more with which the entire semiconductor layer 11 is depleted, the drain current ID limited by the resistor 15 flows, so the problem of the first embodiment, where the drain current ID cannot flow at a voltage with which the entire semiconductor layer 11 is depleted or more, can be solved.

In the embodiments of the present invention, a MOSFET was described as an example of a transistor, but this is not limited to MOSFET, since a similar effect can be exhibited merely if the transistor is one of which the ON current is controlled according to the control voltage, such as an insulation gate bi-polar transistor.

It is apparent that the present invention is not limited to the above embodiment that may be modified and changed without departing from the scope and spirit of the invention.

What is claimed is:

1. A semiconductor device, comprising:
   an output transistor for controlling current that flows between a first terminal and a second terminal;
   a detection transistor connected in parallel with the output transistor;
   a detection resistor connected in series with the detection transistor, for detecting current that flows through the detection transistor as detection voltage and of which the resistance value is set in proportion to the potential difference between the first terminal and the second terminal; and
   an over-current protection transistor for decreasing the ON current of the output transistor and the detection transistor according to the increase of the detection voltage.

2. The semiconductor device according to claim 1, wherein the detection resistor is formed in the semiconductor area connected to the first terminal, and is made of a semiconductor layer containing impurities of which the conductive type is opposite the conductive type of the impurities contained in the semiconductor area.

3. The semiconductor device according to claim 2, wherein the semiconductor layer is formed to be depleted by applying a reverse bias to a junction portion composed of the semiconductor layer and the semiconductor area.

4. The semiconductor device according to claim 1, further comprising a fixed resistor which is connected in parallel with the detection resistor and of which the resistance value is fixed.

5. The semiconductor device according to claim 1, wherein the output transistor is a field effect transistor, the first terminal is a drain terminal, and the second terminal is a source terminal.

6. The semiconductor device according to claim 1, wherein the output transistor and the detection transistor are vertical type field effect transistors.

7. The semiconductor device according to claim 1, wherein the output transistor and the detection transistor are vertical type field effect transistors having a gate electrode with a trench structure.

8. A semiconductor device, comprising:
   a drive circuit for controlling drive current that flows through a load;
   a detection resistor to which detection current for detecting the drive current is supplied and of which the resistance value changes based on a predetermined potential of the drive circuit on a route where the drive current flows; and
   a control circuit for controlling the drive status of the drive circuit based on the voltage of the detection resistor.

9. The semiconductor device according to claim 8, wherein the detection resistor is formed by stacking a first semiconductor layer and a second semiconductor layer, the resistance value of the detection resistor is a resistance value of the first semiconductor layer, and the predetermined potential is supplied to the second semiconductor layer.

10. The semiconductor device according to claim 9, wherein the second semiconductor layer is formed by stacking a semiconductor layer of which the impurity density is high and a semiconductor layer of which the impurity density is low, the first semiconductor layer is adjacent to the low density semiconductor layer side and the predetermined potential is supplied to the high density semiconductor layer side.

11. The semiconductor device according to claim 8, wherein the first semiconductor layer is a p-type semiconductor layer and the second semiconductor layer is an n-type semiconductor layer.

12. The semiconductor device according to claim 8, further comprising a resistor which is connected in parallel with the detection resistor and of which the resistance value is fixed.

13. The semiconductor device according to claim 8, wherein the drive circuit is a vertical type field effect transistor.

14. A semiconductor device, comprising:
   an output transistor of which drain is connected to a first power supply via a load and source is connected to a second power supply;
   a detection transistor of which drain is connected to the drain of said output transistor and gate is connected to the gate of the output transistor;
   a detection resistor of which one end is connected to the source of the detection transistor and the other end is connected to the source of the output transistor, and of which resistance value changes based on the drain voltage of the output transistor; and an over-current protection transistor of which drain is connected to the gate of the output transistor, source is connected to the source of the output transistor, and gate is connected to the source of the detection transistor.

15. The semiconductor device according to claim 14, wherein the detection resistor further comprises:
   an n-type semiconductor layer of which the impurity density is high;
   an n-type semiconductor layer which is formed on the high density n-type semiconductor layer, and of which the impurity density is low; and
   a p-type semiconductor layer which is formed on the low density n-type semiconductor layer.

16. The semiconductor device according to claim 15, wherein the high density n-type semiconductor layer is connected to the drain of the output transistor, and the resistance value of the p-type semiconductor layer is the resistance value of the detection resistor.

17. The semiconductor device according to claim 14, further comprising a resistor which is connected in parallel with the detector resistor.

* * * * *